June 19, 1956 H. A. ROBINSON 2,751,500

FREQUENCY MONITORING ARRANGEMENT

Filed Nov. 10, 1953 2 Sheets-Sheet 1

INVENTOR.
HARRIS A. ROBINSON

BY H. A. Rechif

AGENT

June 19, 1956 H. A. ROBINSON 2,751,500
FREQUENCY MONITORING ARRANGEMENT
Filed Nov. 10, 1953 2 Sheets-Sheet 2

INVENTOR.
HARRIS A. ROBINSON
BY F.A. Rechif
AGENT

United States Patent Office 2,751,500
Patented June 19, 1956

2,751,500

FREQUENCY MONITORING ARRANGEMENT

Harris A. Robinson, Palmyra, N. J., assignor, by mesne assignments, to the United States of America as represented by the Secretary of the Air Force Application November 10, 1953, Serial No. 391,263

11 Claims. (Cl. 250—36)

Figure 1:
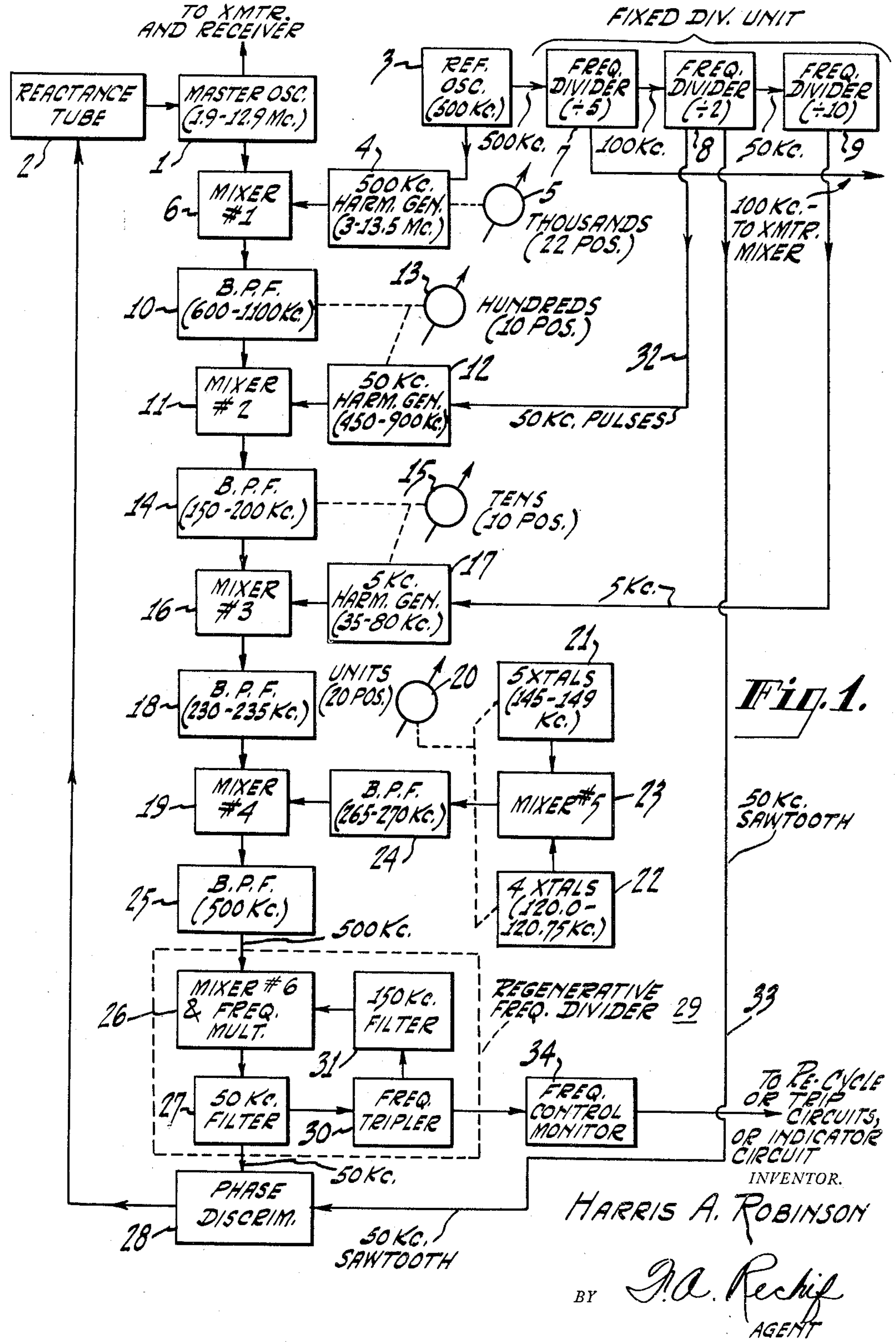

This invention relates to a frequency monitoring arrangement, and more particularly to an arrangement of this character applicable to the frequency generator of a multichannel transmitter-receiver.

This invention is useful in a controlled oscillator type of multi-channel frequency generator such as that described in my coppending application, Serial No. 257,148, filed November 19, 1951. Said application discloses a frequency generator for controlling the frequency of a master oscillator used as a heterodyne oscillator in a receiver and also as a carrier generator in the associated transmitter, this oscillator being selectively tunable to any one of a large number of channels (e. g., 44,000 channels) by means of a channel selecting device the operation of which initiates an automatic tuning cycle which when completed brings the oscillator frequency to a value such that communication may be then carried on in the desired, selected single channel. Said frequency selection and automatic tuning cycle are fully described in my aforesaid application.

Between any two successive normal frequency selections and automatic tuning cycles, and while communication is being carried on, there are a great many factors which might result in a loss of frequency control of the master oscillator and a consequent variation of the master oscillator frequency from the desired value. These factors are multiplied in number because of the use of the equipment in aircraft, for which such equipment is particularly adapted. Some of these factors are as follows: (1) sudden or excessive shifting of oscillator tuning elements, or of switch contacts or circuit components under shock or vibration; (2) excessive drift of oscillator tuned circuits, or related tuned circuits because of wide variations in ambient temperature; (3) tube, component or wiring failures, particularly in the frequency controlling circuits; (4) changes in signal levels in the frequency control circuits resulting from a sustained voltage drop in the power source, or from tube or crystal aging, etc.; and (5) disturbance of frequency control because of severe fluctuation of power sources, etc.

In order to prevent any possible outage of communications which might arise because of loss of frequency control of the master oscillator, it is exceedingly important to monitor the frequency control system and to give warning or similar indication if any sustained interruption or loss of frequency control should occur. This is particularly important since, in general, the persons operating the equipment are not of a type such as would readily recognize a loss of frequency control. It may be desirable, instead of or in addition to merely giving a warning of loss of frequency control, to automatically re-cycle the equipment in such a case, or in other words, to initiate an automatic tuning cycle.

An object of this invention is to devise a novel frequency monitoring system for a multi-channel frequency generator.

Another object is to provide a novel circuit arrangement for an oscillator frequency control system which operates to give an indication in response to any sustained interruption or loss of frequency control.

Since the circuit of this invention operates to monitor the frequency control system and to provide a suitable indication of any sustained interruption or loss of frequency control, it has been aptly termed a "watchdog circuit."

The objects of this invention are accomplished, briefly, in the following manner: the frequency generator or frequency control system for the master oscillator of a transmitter-receiver includes a plurality of cascaded mixers in the first of which the master (captive) oscillator frequency is mixed with a selected crystal-stabilized frequency and in the subsequent ones of which the various resultant beat frequencies are mixed with respective selected crystal-stabilized frequencies. Following the final mixer, in which a fixed beat frequency (e. g., 500 kc.) is produced, a regenerative-type frequency divider is used to divide this frequency down to 50 kc. to provide one input to a phase discriminator. Any interruption or loss of frequency control of the captive oscillator results in a marked change in the grid voltage of a tube in this divider, and this change is utilized, through a long time constant circuit, to provide an indication and/or to initiate a re-cycle of the automatic tuning.

Figure 2:
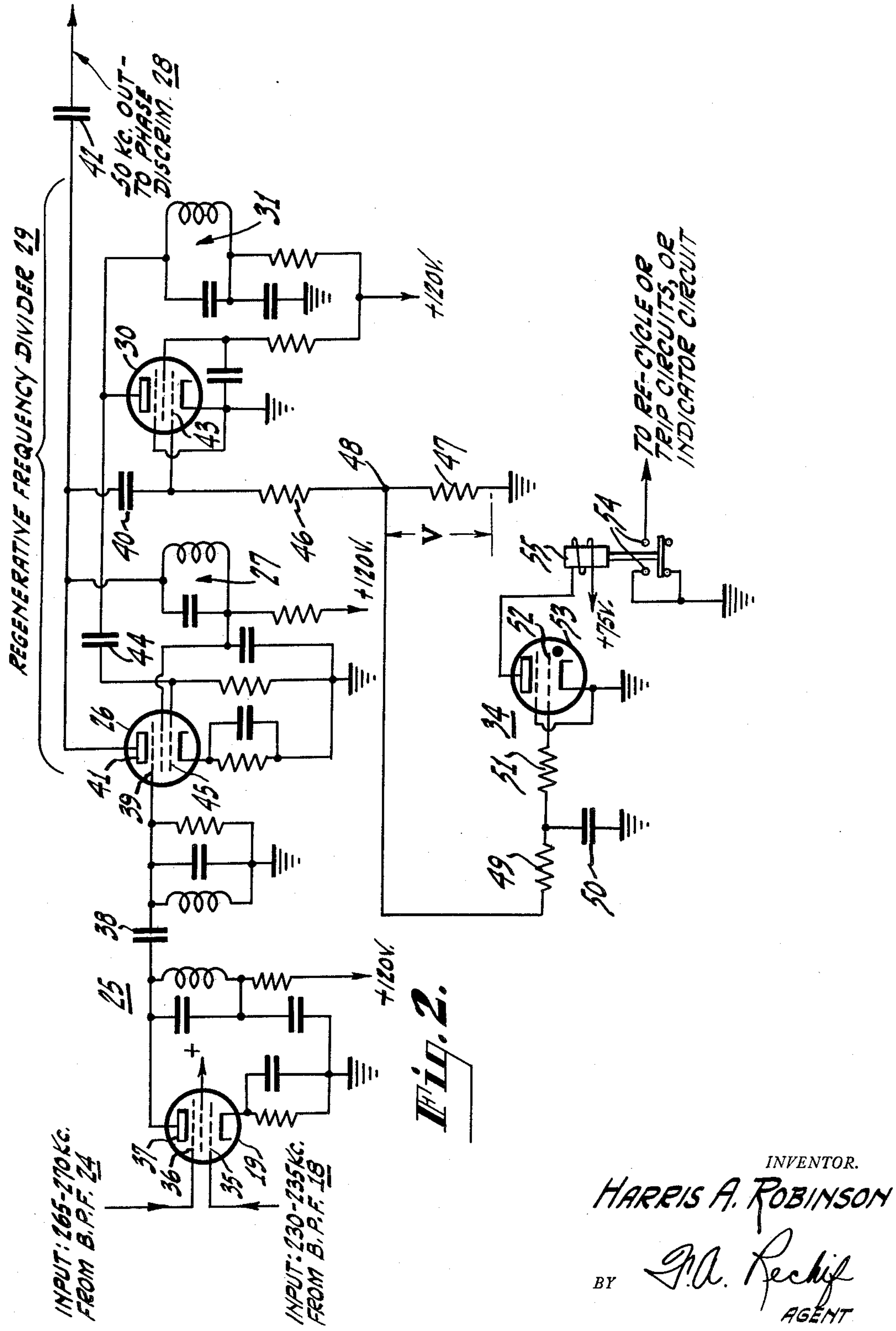

The foregoing and other objects of the invention will be better understood from the following description of an exemplification thereof, reference being had to the accompanying drawings, wherein:

Fig. 1 is a block diagram of a typical frequency control system in which the frequency monitoring arrangement of this invention may be utilized; and Fig. 2 is a detailed schematic of a monitoring arrangement according to this invention.

Referring now to Fig. 1, which illustrates a frequency control system with which the monitoring system of this invention may be utilized, the master oscillator 1 is the oscillator that is automatically controlled in frequency by the frequency control system illustrated, and the output of this oscillator is utilized in the transmitter-receiver (not shown) with which the system illustrated is associated. The transmitter-receiver may for example be arranged as disclosed in my aforesaid copending application. The master captive oscillator 1 is arranged to be permeability tuned and has an output frequency of 1.9 to 12.9 mc. (in several bands), as indicated. Exact frequency control of oscillator 1 is obtained by means of reactance tube 2 coupled to oscillator 1.

The frequency control system illustrated utilizes harmonic generators excited from a crystal-stabilized oscillatory source. The heart of the unit which acts as the oscillatory source is a 500-kc. reference crystal-controlled oscillator 3 which is extremely stable. Output of 500 kc. from reference oscillator 3 drives a 500-kc. harmonic generator 4. Generator 4 is preferably of the two-stage type described and claimed in my copending application, Serial No. 253,141, filed October 25, 1951. A "Thousands" selection switch 5 has twenty-two positions and is mechanically coupled to a frequency selecting means in generator 4 so that any selected one of the 6th through 27th harmonics of the 500-kc. input to generator 4 may be passed from said generator to #1 mixer 6, depending upon the position of switch 5. Output from the master oscillator 1 is also supplied to mixer 6 and this oscillator frequency, beating with the output frequency of generator 4 in such mixer, produces a difference frequency mixer output which may vary from 600 to 1100 kc., depending upon the frequency selection switch settings.

The 500-kc. output of oscillator 3 drives a series of cascaded locked-in oscillator frequency dividers, beginning with a 100-kc. locked-in oscillator 7 the output of which drives a 50-kc. stage 8 whose output, in turn, drives a 5-kc. stage 9. The 50-kc. stage 8 includes amplifier and pulse shaper circuits whereby 50-kc. pulses and a 50-kc. sawtooth wave may be derived from this stage for utilization in circuits to be later described.

The 600–1100 kc. difference frequency output of mixer 6 is passed through a bandpass filter 10 to provide one of the inputs to #2 mixer 11, the other input being provided from a 50-kc. harmonic generator 12. The generator 12 is supplied with 50-kc. pulse input derived from divider stage 8 over lead 32 and harmonics of this input frequency lying in the range of 450 to 900 kc. are selected by the "Hundreds" selection switch 13, which has ten positions. The particular harmonic of 50 kc. selected at the output of generator 12 depends of course upon the position of switch 13, and this selected harmonic is passed on to mixer 11 as input to mix with signal from filter 10. The selective circuit in filter 10 is tuned approximately by the "Hundreds" switch 13.

Output from mixer 11 is transferred, through the selective circuit bandpass filter 14, tunable in ten steps between 150 and 200 kc. as the "Tens" switch 15 (which has ten positions) determines, to #3 mixer 16. A 5-kc. harmonic generator 17 is supplied with 5-kc. input derived from divider stage 9 and harmonics of this input frequency lying in the range of 35 to 80 kc. are selected by the "Tens" switch 15. The particular harmonic of 5 kc. which is selected by switch 15 from generator 17, is passed on to mixer 16 as input to mix with signal from filter 14.

Output from mixer 16 is transferred through the bandpass filter 18, which passes a frequency band from 230 to 235 kc. to #4 mixer 19. The "Units" switch 20, which has twenty positions, selects crystals in crystal oscillator units 21 and 22. One of the group of four crystals from 120.0 to 120.75 kc. in oscillator 22 is selected, while one of the group of five crystals from 145 to 149 kc. in oscillator 21 is selected. The crystals in oscillator 22 have frequencies of 120.0, 120.25, 120.5 and 120.75 kc., while those in oscillator 21 have frequencies of 145, 146, 147, 148 and 149 kc. The outputs of the two crystal oscillators 21 and 22 excite #5 mixer 23, the switching actuated by "Units" switch 20 being arranged to produce output from mixer 23 of any one of twenty frequencies, spaced every 250 cycles in the range from 265 to 269.75 kc. A bandpass filter 24 couples this mixed crystal output to #4 mixer 19.

The output of #4 mixer 19 is nominally 500 kc. In other words, as the master oscillator 1 is scanned through a band of frequencies there will be one segment of the oscillator tuning range, corresponding to the settings of the switches 5, 13, 15 and 20 (which determine the selected frequencies fed to the several mixers) where a signal near 500 kc. will be developed in the output of mixer 19; this signal output in the vicinity of 500 kc. corresponds closely to the desired correct tuning of the master oscillator 1. A specific numerical example will make this clearer. Suppose that the master oscillator frequency is 3,462.5 kc. Then the 9th harmonic of 500 kc. is selected in harmonic generator 4 and this 4500-kc. frequency combines in mixer 6 with the 3,462.5-kc. output of the master oscillator 1, giving a difference frequency of 1037.5 kc. which is passed through filter 10 to mixer 11. The 17th harmonic of 50 kc., which is 850 kc., is selected from harmonic generator 12 and this frequency combines with the 1037.5-kc. frequency in mixer 11 to give a difference frequency of 187.5 kc. which is passed through filter 14 to mixer 16. The 9th harmonic of 5 kc., which is 45 kc., is selected in harmonic generator 17 and this frequency combines with the 187.5-kc. frequency in mixer 16 to give a sum frequency of 232.5 kc. which is passed through filter 18 to mixer 19. In the oscillator 22, a frequency of 120.5 is selected, while in the oscillator 21 a frequency of 147 kc. is selected. These latter two frequencies are mixed in mixer 23 to give a sum frequency of 267.5 kc. which is passed through filter 24 to mixer 19. This 267.5-kc. frequency combines with the 232.5-kc. frequency in mixer 19 to give a sum frequency of 500.0 kc. which is passed through a selective filter 25 (tuned to 500 kc.) to a mixer 26, in the latter to be divided down, in effect, to 50 kc., for example, which passes through a filter 27 to a phase discriminator 28. The mixer 26 constitutes part of a regenerative frequency divided 29 (indicated by the dotted-line enclosure which is so labeled) which is located between the output of filter 25 and phase discriminator 28, and which functions to divide the 500-kc. input thereto (from filter 25) by ten, to provide a 50 kc. output for phase discriminator 28.

The harmonic generator-mixer arrangement described is exactly the same as disclosed in my said copending application, Serial No. 257,148. The arrangement described constitutes a multi-channel frequency generator, providing 44,000 frequency channels for the master oscillator 1, one channel every 250 cycles in the range extending from 1.9 to 12.9 mc. Each frequency channel is selected by the setting of the four switches 5, 13, 15 and 20.

The 50-kc. output of divider 29 is coupled as one input to phase discriminator 28, preferably through an amplifier and phase inverter arrangement (not shown). A 50-kc. sawtooth-shaped output derived from divider stage 8 over lead 33 is supplied as the other input to phase discriminator 28. In the phase detector or discriminator 28 a direct current control output results from the phase comparison of the 50-kc. signal from filter 27 and the 50-kc. sawtooth signal derived from the reference 50-kc. source 8. The control output of the phase discriminator is direct coupled (preferably through a cathode follower stage, not shown) to the grid of the reactance tube 2 for the master oscillator 1, in order to correct for frequency drifts of the master oscillator 1.

The foregoing constitutes an automatic frequency control system for the captive master oscillator 1, by means of which the master oscillator is stabilized in frequency by a phase discriminator 28 which compares the heterodyned output of oscillator 1 (heterodyned through cascaded mixers 6, 11, 16, 19 and 26) with the divided output of the reference crystal oscillator 3 (divided through dividers 7 and 8).

It is desired to be pointed out that the heterodyned frequencies originating from oscillator 1 and produced by the successive mixing steps in the mixers 6, 11, 16, 19 and 26 have to pass through all of the selective circuits 10, 14, 18 and 25. If there is a tube, component or wiring failure anywhere in the entire frequency control system, including all of the units 1—4, 6—12, 14, 16—19 and 21—25, the 500-kc. signal will disappear from the output of filter 25, since due to the cascaded mixing arrangement described it is necessary that all signal-producing and signal-transferring units be operating properly, in order to produce a 500-kc. signal at the output of filter 25. In addition to actual failures, changes in signal levels in the various mixing or harmonic generating circuits resulting from voltage drops in the power supply, or from tube or crystal aging, etc., cause the 500-kc. signal to decrease or disappear from the output of filter 25. Also, severe fluctuations of the power sources may disturb the frequency control system enough to cause disappearance of the 500-kc. signal. Even sudden or excessive shifting of the oscillator tuning elements, or of the positions or contacts of switches such as 5, 13, 15 and 20 will cause disappearance of the 500-kc. signal from the output of filter 25. Also, excessive drift of tuned circuits in the oscillator 1, or related tuned circuits, with wide variations in ambient temperature, may cause the various beat or heterodyne frequencies to drift out of the passbands of the various bandpass filters, in which case the 500-kc. signal will disappear from the output of filter 25. All of the "faults" mentioned in this paragraph might result in a loss of frequency control of the oscillator 1, after the normal frequency selection and tuning cycle of this controlled oscillator have been completed.

Each of the "faults" mentioned in the preceding paragraph, as well as certain other "faults," may result in the disappearance of 500-kc. signal from the output of filter 25, or in the decrease of this signal below a usable amplitude level, and the consequent disappearance of 50-kc. signal from the output of frequency divided 29. The disappearance of one of the 50-kc. input signals to phase discriminator 28 (that discriminator input signal which is derived from divider 29) interrupts the frequency control of captive oscillator 1, since under these conditions the output of discriminator 28 is interrupted and the control of oscillator 1 by means of reactance tube 2 is consequently interrupted. If the interruption of frequency control of the oscillator 1 (arising from the disappearance of the 500-kc. signal from the output of filter 25, or a substantial decrease of this signal, due to any "fault") is sufficiently short, there will be no serious deviation in the frequency of the master oscillator 1, since in this case the oscillator will tend to remain at, or return closely to, its original frequency. However, the stability of the master oscillator 1 is inherently impaired by the necessity of adding a relatively unstable reactance frequency control tube 2 thereto, in order to obtain a precision frequency control. Therefore, the oscillator 1 does have a tendency to deviate or shift in frequency if frequency control is interrupted. Since the precision frequency control arrangement disclosed utilizes a phase discriminator (not a frequency discriminator), a sustained phase shift in the master oscillator resulting from any of the previous-stated "faults" can be tolerated by the phase discriminator without "break-out" over only a limited range (this latter assumes that the "fault" is in the oscillator tuning itself, so that the phase discriminator input from divider 29 does not entirely disappear). Thus, when any interruption of the frequency control occurs, due to tube or component failures, or to any sudden disturbance in the mechanical or electrical components of the control system, etc. the master oscillator frequency either deviates or is lost, resulting in a loss of 500-kc. input to frequency divider 29.

The frequency divider 29 is of the regenerative type. The 500-kc. output from filter 25 is coupled to the regenerative frequency divider 29, comprising #6 mixer 26 the output of which is fed to a 50-kc. filter or output tank 27, the divider also including a frequency tripler 30 which receives output from filter 27, and a 150-kc. filter or tank 31 which receives output from tripler 30 and transfers its output signal to the input side of mixer 26, which also functions as a frequency multiplier to multiply the 150-kc. signal received from filter 31 to a frequency of 450-kc. to beat with the 500-kc. signal received from filter 25, thereby producing the 50 kc. required for filter 27. This regenerative frequency divider operates, in effect, to divide the 500-kc. signal at the output of filter 25 down to a frequency of 50 kc. at the output of filter 27. This provides a frequency division ratio of ten.

The frequency monitoring arrangement 34 of this invention, which operates to monitor the frequency control system of Fig. 1 and which may therefore be termed a "frequency control monitor," is coupled to the frequency tripler 30 of regenerative frequency divider 29, as will become apparent hereinafter from a consideration of Fig. 2.

Now referring to Fig. 2, which is a detailed schematic of regenerative frequency divider 29, frequency control monitor 34, mixer 19 and filter 25, the output of bandpass filter 18, which is a signal within the 230–235 kc. range, is applied to the control grid 35 of #4 mixer tube 19 and the output of bandpass filter 24, which is a signal within the 265–270 kc. range, is applied to the suppressor grid 36 of tube 19, which tube is a pentode vacuum tube. The two frequencies applied to tube 19 are mixed therein, and the beat (sum) frequency of 500 kc. appears at anode 37 of this tube, as well as other beat frequencies.

The 500-kc. frequency is selected from the output or anode circuit of mixer 19 by means of the bandpass filter 25 tuned to pass 500 kc. and consisting of two resonant circuits tuned to 500 kc. and coupled together by means of a capacitor 38, one of these two resonant circuits (on one side of capacitor 38) being connected directly to anode 37 and the other of these two circuits (on the other side of capacitor 38) being connected directly to the suppressor grid 39 of #6 mixer tube 26, which constitutes the first stage of regenerative frequency divider 29 and which is a pentode vacuum tube. Mixer tube 26 serves as a mixer and frequency multiplier. A resonant filter circuit 27, tuned to 50 kc., is connected directly to the anode 41 of tube 26. The 500-kc. signal applied to grid 39 of tube 26 is in effect divided down to 50 kc. at the anode 41 of tube 26, and this 50-kc. signal (selectively passed by tuned circuit 27) is taken off from anode 41 by means of a coupling capacitor 42 and applied as one input to the phase discriminator 28 of Fig. 1. This 50-kc. signal passing through capacitor 42 constitutes the output of frequency divider 29.

The 50-kc. signal appearing at anode 41 is also applied through a coupling capacitor 40 to the control grid 43 of the frequency tripler tube 30, which also is a pentode vacuum tube. Tube 30 is biased so that it operates as a frequency tripler, producing a 150-kc. signal from the 50-kc. signal input thereto, this 150-kc. signal being selectively passed by means of a resonant filter circuit 31 connected directly to the anode of tube 30 and tuned to 150 kc. The 150-kc. signal appearing at the anode of tube 30 is applied through a coupling capacitor 44 to the control grid 45 of tube 26.

As previously stated, tube 26 functions in effect as a frequency multiplier to multiply the 150-kc. signal received from the anode of tripler 30, by way of filter 31, to a frequency of 450 kc. which beats, in tube 26, with the 500-kc. signal received from filter 25, thereby producing a 50-kc. signal at anode 41 which is transmitted on to phase discriminator 28 for utilization therein.

In the regenerative frequency divider 29 as disclosed herein, the tripler 30 drives the mixer 26 very hard, gating the 500-kc. input signal to tube 26 (from filter 25) at a 150 kc. rate (the frequency of the signal at the anode of tube 30, selected by filter 31), resulting in a strong 50-kc. component in the mixed anode current (of anode 41), and hence a 50-kc. voltage across the 50-kc. tuned circuit 27. Thus, the regenerative frequency divider 29, during its normal operation, divides the 500-kc. input signal applied to grid 39 down to a 50-kc. signal at the anode 41( across tuned circuit 27), effecting a division by ten.

The characteristics of the regenerative frequency divider 29, comprising #6 mixer 26 and tripler stage 30, are such that under normal frequency control of oscillator 1 (when conditions are normal, so that there is a 500-kc. signal of the proper magnitude at the output of bandpass filter 25) the voltage on the control grid 43 of the tripler 30 is relatively high, developing a negative bias of approximately 20 volts. However, when any interruption of the frequency control occurs, due to tube or component failures, etc. the master (captive) oscillator frequency deviates or is lost, resulting in a loss of 500-kc. input to mixer 26, as explained hereinabove. Since frequency divider 29 is of the regenerative type, this loss of 500-kc. input to such divider produces a marked change in the operation of such divider, as compared to the normal operation thereof. In fact, the loss of 500-kc. input to mixer 26 causes a marked drop in the bias voltage on control grid 43 of the tripler tube 30, to approximately four volts negative.

In accordance with the invention, frequency monitoring is accomplished by coupling a frequency control monitor circuit 34 to the control grid 43 of the tripler tube 30. A voltage divider consisting of two resistors 46 and 47 in series, is connected from grid 43 to ground, in order to apply a suitable portion V (the voltage across resistor 47) of the change in control grid voltage of tube 30 to the frequency control monitor circuit 34. The point 48, which is the junction between resistors 46 and 47, is connected through a long time-constant RC circuit, consisting of a series resistor 49 and a capacitor 50 connected between one end of resistor 49 and ground, and through another series resistor 51, to the control grid 52 of a gas tetrode 53. The resistor 49 may have a value of 4.7 megohms and the capacitor 50 a value of 0.1 mfd., for example. Thus, the voltage V, between point 48 and ground, is applied to the grid 52 of tube 53, through the time-constant or delay circuit 49, 50.

As previously described, the negative voltage on grid 43 drops markedly when interruption of the frequency control due to tube or component failures, etc. causes a loss of 500-kc. signal input to mixer 26. This drop of negative voltage (or a portion V thereof) is applied to the grid 52 of gas tube 53, causing this tube to lose its negative bias and to then conduct. A relay 55 is connected in the anode circuit of tube 53 and this relay is energized when tube 53 conducts, to close the normally-open relay contacts 54. The closing of contacts 54 may initiate a "start cycle" pulse to re-cycle the automatic tuning of oscillator 1, this automatic tuning then operating in the same manner as it does when the equipment is first turned on, or when the captive oscillator 1 is shifted to a new frequency. Alternatively or simultaneously, the contacts of relay 55 may operate to give warning or indication of loss of frequency control, or to trip the equipment power off.

If the loss of frequency control of the captive oscillator is sufficiently short in duration, the master oscillator frequency does not deviate appreciably, so that in this case no indication or re-cycling needs to be brought about by the frequency control monitor 34. The RC time constant or time delay circuit 49—50 delays the action of tube 53 for any merely momentary disturbance or transient in the frequency control system, so that any momentary loss of frequency control (and any consequent momentary drop in negative voltage at point 48) will not cause tube 53 to fire.

What is claimed is:

1. A frequency control system for an oscillator comprising at least one mixer excited by waves from said oscillator and by waves of stable frequency to produce beat frequency resultant waves, a frequency divider receptive of the output of said mixer for producing therefrom divided-frequency waves, means responsive to variations in the frequency of said divided-frequency waves from a predetermined value for controlling the frequency of said oscillator, and means in circuit with said frequency divider, and responsive to the decrease below a certain amplitude level of said resultant waves applied to said divider, for closing a signal circuit.

2. A frequency control system for an oscillator comprising at least one mixer excited by waves from said oscillator and by waves of stable frequency to produce beat frequency resultant waves, selective means receptive of said resultant waves for passing waves of a predetermined frequency, a frequency divider receptive of the output of said selective means for producing therefrom divided-frequency waves, means responsive to variations in the frequency of said divided-frequency waves from a predetermined value for controlling the frequency of said oscillator, and means in circuit with said frequency divider, and responsive to the decrease below a certain amplitude level of said resultant waves applied to said divider, for closing a signal circuit.

3. A frequency control system for an oscillator comprising a plurality of cascaded mixers, means for applying waves from said oscillator to the first of said mixers, separate means for applying waves of stable frequency to each respective one of said mixers, selective means coupled to the last of said mixers for passing waves of a predetermined frequency, a frequency divider receptive of the output of said selective means for producing therefrom divided-frequency waves, means responsive to variations in the frequency of said divided-frequency waves from a predetermined value for controlling the frequency of said oscillator, and means in circuit with said frequency divider, and responsive to the decrease below a certain amplitude level of the beat frequency resultant waves produced in said last mixer and applied therefrom through said selective means to said divider, for closing a signal circuit.

4. A frequency control system for an oscillator comprising at least one mixer excited by waves from said oscillator and by waves of stable frequency to produce beat frequency resultant waves, a regenerative-type frequency divider receptive of the output of said mixer for producing therefrom divided-frequency waves, the decrease below a certain amplitude level of said resultant waves applied to said divider causing a substantial voltage change to occur in said divider, means responsive to variations in the frequency of said divided-frequency waves from a predetermined value for controlling the frequency of said oscillator, and means in circuit with said frequency divider, and responsive to said substantial voltage change occurring therein, for closing a signal circuit.

5. A system in accordance with claim 4, wherein said frequency divider includes a tube operating as a frequency multiplier, wherein the said substantial voltage change occurs at the grid of said tube, and wherein the last-named means is connected to the grid of said tube.

6. A system in accordance with claim 4, wherein the last-named means includes a gaseous discharge device which is fired in response to the occurrence of said substantial voltage change.

7. A system in accordance with claim 4, wherein said frequency divider includes a tube operating as a frequency multiplier, wherein the said substantial voltage change occurs at the grid of said tube, and wherein the last-named means includes a gaseous discharge device connected to the grid of said tube and fired in response to the occurrence of said substantial voltage change.

8. A frequency control system for an oscillator comprising a plurality of cascaded mixers, means for applying waves from said oscillator to the first of said mixers, separate means for applying waves of stable frequency to each respective one of said mixers, a regenerative-type frequency divider receptive of the output of the last of said mixers for producing therefrom divided-frequency waves, the decrease below a certain amplitude level of the beat frequency resultant waves produced in said last mixer and applied therefrom to said divider causing a substantial voltage change to occur in said divider, means responsive to variations in the frequency of said divided-frequency waves from a predetermined valve for controlling the frequency of said oscillator, and means in circuit with said frequency divider, and responsive to said substantial voltage change occurring therein, for closing a signal circuit.

9. A system in accordance with claim 8, wherein said frequency divider includes a tube operating as a frequency multiplier, wherein the said substantial voltage change occurs at the grid of said tube, and wherein the last-named means is connected to the grid of said tube.

10. A system in accordance with claim 8, wherein the last-named means includes a gaseous discharge device which is fired in response to the occurrence of said substantial voltage change.

11. A system in accordance with claim 8, wherein said frequency divider includes a tube operating as a frequency multiplier, wherein the said substantial voltage change occurs at the grid of said tube, and wherein the last-named means includes a gaseous discharge device connected to the grid of said tube and fired in response to the occurrence of said substantial voltage change.

References Cited in the file of this patent

UNITED STATES PATENTS

| | | |
|---|---|---|
| 2,245,685 | Koch | June 17, 1941 |
| 2,406,125 | Ziegler et al. | Aug. 20, 1946 |
| 2,550,519 | Battaille | Apr. 24, 1951 |
| 2,558,129 | Favre | June 26, 1951 |
| 2,581,594 | MacSorley | Jan. 8, 1952 |
| 2,584,780 | Beard et al. | Feb. 5, 1952 |
| 2,605,425 | Hugenholtz | July 29, 1952 |